(12) United States Patent
Furuta

(10) Patent No.: US 8,217,460 B2
(45) Date of Patent: Jul. 10, 2012

(54) SEMICONDUCTOR DEVICE WITH ELECTROSTATIC PROTECTION DEVICE

(75) Inventor: Hiroshi Furuta, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 187 days.

(21) Appl. No.: 12/801,216

(22) Filed: May 27, 2010

(65) Prior Publication Data

US 2010/0320539 A1 Dec. 23, 2010

(30) Foreign Application Priority Data

Jun. 18, 2009 (JP) ................................. 2009-145017

(51) Int. Cl.
*H01L 23/62* (2006.01)
(52) U.S. Cl. .................... 257/355; 257/256; 257/257
(58) Field of Classification Search .......... 257/355–364, 257/E29.008, E29.015
See application file for complete search history.

(56) References Cited

U.S. PATENT DOCUMENTS

| | | | |
|---|---|---|---|
| 5,610,790 A | 3/1997 | Staab et al. | |
| 6,329,691 B1 | 12/2001 | Finzi | |
| 6,617,649 B2 * | 9/2003 | Chang et al. | 257/355 |
| 6,894,351 B2 * | 5/2005 | Okawa et al. | 257/347 |
| 7,067,884 B2 | 6/2006 | Okushima | |
| 2004/0155291 A1 | 8/2004 | Okushima | |

FOREIGN PATENT DOCUMENTS

| | | |
|---|---|---|
| JP | 10-512718 A | 12/1998 |
| JP | 2004-207398 A | 7/2004 |

* cited by examiner

*Primary Examiner* — Cuong Q Nguyen
(74) *Attorney, Agent, or Firm* — McGinn IP Law Group, PLLC

(57) ABSTRACT

A semiconductor device has an SOI (Silicon On Insulator) structure and comprising a P-channel FET and an N-channel FET which are formed on an insulating film. The semiconductor device includes: at least two of first, second, third and fourth PN-junction elements. The first PN-junction element is formed from a P-type semiconductor layer and an N-type semiconductor layer having the same impurity concentrations as those of source/drain regions of the P-channel FET and the N-channel FET, respectively. The second PN-junction element is formed from a P-type semiconductor layer and an N-type semiconductor layer having the same impurity concentrations as those of the source/drain region and a channel region in the P-channel FET, respectively. The third PN-junction element is formed from a P-type semiconductor layer and an N-type semiconductor layer having the same impurity concentrations as those of a channel region and the source/drain region in the N-channel FET, respectively. The fourth PN-junction element is formed from a P-type semiconductor layer and an N-type semiconductor layer having the same impurity concentrations as those of the channel regions of the N-channel FET and the P-channel FET, respectively. At least two PN-junction elements are connected in series in a forward bias between two different terminals to form an electrostatic protection device.

20 Claims, 10 Drawing Sheets

D1   Vf=0.8V
D2-1 Vf=0.6V
D2-2 Vf=0.6V

LARGE DESIGN MARGIN (Wd1)

SMALL DESIGN MARGIN (Wd2)

EXTREMELY SMALL DESIGN MARGIN

Fig. 2 CONVENTIONAL ART

|  | COUNT n | Vh[V] | NECESSARY SIZE | SIZE RATIO |
|---|---|---|---|---|
| Vf=0.6V | 4 | 2.4 | 816 | 1 |
| Vf=0.7V | 3 | 2.1 | 417 | 0.51 |
| Vf=0.8V | 3 | 2.4 | 462 | 0.57 |

|  | COUNT n | Vh[V] | NECESSARY SIZE | SIZE RATIO |
|---|---|---|---|---|
| Vf=0.6V | 4 | 2.4 | 816 | 1 |
| Vf=0.8V | 3 | 2.4 | 462 | 0.57 |
| 1ST EMBODIMENT | 3 | 2.2 | 429 | 0.53 |

N⁺ P⁺ JUNCTION

IMPURITY DENSITY
DISTRIBUTION IN $N^+P^+$ JUNCTION

FORMING STEP OF $N^+P^+$ JUNCTION

SEMICONDUCTOR LAYER

SD As I/I

SD BF$_2$ I/I

Fig. 6B
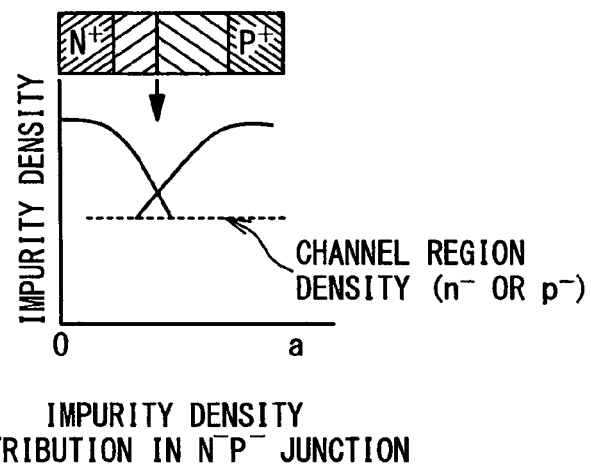
IMPURITY DENSITY
DISTRIBUTION IN N⁻P⁻ JUNCTION
Fig. 6C-1
FORMING STEP OF N⁻ P⁻ JUNCTION
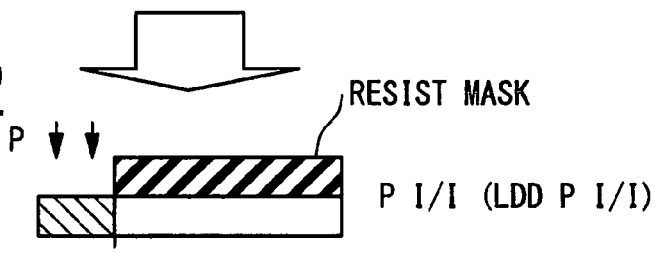
Fig. 6C-2
Fig. 6C-3

SEMICONDUCTOR DEVICE WITH ELECTROSTATIC PROTECTION DEVICE

INCORPORATION BY REFERENCE

This patent application claims a priority on convention based on Japanese Patent Application No. 2009-145017 filed on Jun. 18, 2009. The disclosure thereof is incorporated herein by reference.

TECHNICAL FIELD

The present invention relates to a semiconductor device, and particularly, to a semiconductor device having a FinFET or a planar SOI structure FET.

BACKGROUND ART

In recent years, with remarkable progress of high speed operation and high density integration of a semiconductor device, miniaturization of elements, especially, a gate insulating film of a field effect transistor (FET) has become rapidly thin. The thin gate insulating film is easy to be broken. For this reason, a technique related to a protection device is applied to protect the semiconductor device from electrostatic discharge (ESD) before the gate insulating film of the FET is broken down.

With decrease in a power supply voltage and reduction of the gate insulating film in thickness, design of the electrostatic protection device has become difficult. It is required that the electrostatic protection device operates at a snap-back voltage "Vh" after snap-back following an "ON" state, and the snap-back voltage is higher than a power supply voltage, and is lower than a breakdown voltage of the gate insulating film and a circuit breakdown voltage (junction breakdown) "Vo". A difference between the voltage "Vh" and the voltage "Vo" decreases with miniaturization of the element, resulting in decrease in a design margin of the electrostatic protection device.

Under such a situation, an electrostatic protection circuit using an electrostatic protection device which does not perform a snap-back operation has been proposed. As such an electrostatic protection circuit, an electrostatic protection device is configured by serially connecting PN-junction elements in multiple stages between two terminals so as to be biased in a forward direction in a normal operation. In this configuration, although the so-called snap-back operation is not performed, the voltage corresponding to the snap-back voltage "Vh" of the conventional electrostatic protection device is determined as a summation of ON voltages of the PN-junction elements in a forward direction bias which is nearly equal to built-in potential (hereinafter, to be simply referred to as a forward bias voltage), and a product of an ESD current and a summation of equivalent resistances of the PN-junction elements (i.e. effective resistances) must be equal to or smaller than the voltage "Vo". This is simply expressed by a following equation (1):

$$Vdd < n \times Vf < n \times r \times Iesd < Vo \qquad (1)$$

where Vf is the forward bias voltage, r is the equivalent resistance at a forward bias, Iesd is a current at electrostatic discharge, n is the number of PN-junction elements, and Vdd is the power supply voltage or a signal voltage in the normal operation. Usually, in consideration of leakage current suppression (α term) at the forward bias (especially at high temperature) and manufacturing variation (β term), the electrostatic protection device is designed to satisfy a following equation:

$$Vdd + \alpha < n \times Vf < n \times r \times Iesd < Vo - \beta \qquad (2)$$

Conventionally, in a bulk MOSFET process, the PN-junction element is formed as a junction between a diffusion layer and a well. As a matter of course, a structure such as a PN-junction in butted diffusion layer exists. However, in the PN-junction of the butted diffusion layer, the junction between a well and a substrate exists in a bottom surface of the diffusion layer. In the bulk MOSFET, the forward bias voltage of the PN-junction is determined based on an impurity concentration in the well/substrate.

When performing an application test of electrostatic discharge voltage Vesd [V] in an HBM test, the current Iesd in the equation (1) is:

$$Iesd \approx Vesd/1500 \text{ [A]}$$

(in the HBM test, the resistance of 1.5 KΩ is inserted between the element and a test apparatus). It is required that a whole of PN-junction elements does not break down when this current flows.

To satisfy the equation (1) with respect to the voltage Vo, that is, to pass the HBM test applied with the voltage Vesd [V], the resistance R of the whole of the PN-junction elements is approximately expressed as:

$$R \approx Vo/Iesd = 1500 \times Vo/Vesd \qquad (3)$$

At this time, using the number n of elements which satisfies the following relation:

$$n < R/r,$$

the electrostatic protection device is designed.

However, since the resistance r varies depending on a current value, the value of the resistance r cannot be simply determined. Further, the effective resistance of the whole of PN-junction elements can be changed by changing its size. When the PN-junction elements having a large value of r are used, the effective resistance can be adjusted by increasing the size of the PN-junction elements. Generally, the resistance per PN-junction perimeter or PN-junction area is measured and necessary size is determined to satisfy the equation (1) or the equation (2). For this reason, the resistance r has a relatively large design freedom. As a matter of course, since an increase in the size of the protection device leads to an increase in chip size, care should be taken.

In miniaturization of a MISFET (MOSFET), various types of SOI structure FET have been proposed in place of an ordinary bulk MISFET. A planar SOIFET and a FinFET have been developed as the SOI structure FET. The SOI structure FET has superior electrical characteristics to the bulk MISFET.

However, generally, from the viewpoint of electrostatic protection, the SOI structure FET has a lower breakdown voltage against electrostatic discharge (hereinafter to be referred to as ESD endurance) than the bulk MISFET. The SOI structure FET is formed on an insulating film, resulting in a poor heat radiation characteristic. For this reason, when the SOI structure FET is used as a protection device, the ESD endurance lowers.

Under such a situation, with miniaturization of the element, the gate insulating film of the MISFET is made thin due to a low power supply voltage, so that the breakdown voltage is lowered. As a result, an operation voltage range (required voltage-current characteristic) of the electrostatic protection device has been narrowed. An optimum electrostatic protection device in a semiconductor device having the SOI structure FET is required.

Patent literature 1 discloses an example of a configuration that the PN-junction elements of the protection device in the SOI structure device are connected in a forward bias in the ordinary operation.

Diodes 1060 to 1079 in FIG. 10 of the patent literature 1 are biased in the forward direction in the ordinary operation. In this example, the forward bias voltage (described as a forward turn-on voltage in the specification) of each of the diodes 1060 to 1079 is described to be about 0.7V. In other words, it can be considered that the diodes 1060 to 1079 have the same structure. When an applied voltage is larger than the power supply voltage by 7V (0.7V×10=7V in a case of serially-connected 10 diodes) or more, a current flows through the PN-junction elements.

In the conventional technique, in both of the bulk MISFET device and the SOI structure FET device, the electrostatic protection circuit is formed from one type of the PN-junction elements and the forward bias voltages are identical to each other. As compared to a protection device having a snap back characteristic, the protection device as PN-junction elements in the forward bias easily satisfy the equation (1) when a power supply voltage is high and a breakdown voltage of an internal circuit element to be protected is sufficiently high.

However, in a product for a low power supply voltage manufactured to have a thin gate insulating film, it is difficult to satisfy the equation (1) even when the PN-junction elements are used for the protection device. In other words, when protection device having one type of forward bias voltage Vf are used, a design margin becomes small.

FIGS. 1A to 1C schematically show a voltage-current characteristic in a case that a plurality of PN-junction elements are serially connected between two terminals and a current (expressed as Di) flows when the forward bias voltage (ESD voltage) is applied between the two terminals. When the design margin is large (Wd1) as shown in FIG. 1A, the n PN-junction elements or (n+1) PN-junction elements can be used. When the design margin is small (Wd2) as shown in FIG. 1B, the size of the PN-junction element is increased ($\Delta R'$) and only k PN-junction elements can be used. If (k+1) PN-junction elements are used, the size must be made very large. This is impossible due to limitation of the chip size.

In FIGS. 1A and 1B, the forward bias voltage Vf of the protection device is located at a proper "position". However, in an actual product, when one type of Vf (one type even in serial connection) is used, the value of n×Vf in the equation (1) may not be a value near Vdd+$\alpha$. In such a case, the configuration of (n+1) PN-junction elements cannot satisfy a Vo−$\beta$ margin sometimes. This state is shown in FIG. 1C. It is noted that FIG. 1C shows m PN-junction elements.

Specifically, a device is considered which has an operation start voltage Vh (the forward bias Vf of the whole of serially connected PN-junction elements) which satisfies the relation of Vh>2.0V (assuming the device with a power supply voltage of about 1.2 to 1.5V), and the breakdown voltage Vo of the internal element or the protection device itself which satisfies the relation of 5V<(Vo−$\beta$).

Furthermore, it is assumed that the resistance (per basic area or perimeter) with a predetermined basic size of PN-junction is 100$\Omega$ and the resistance is inversely proportional to the size. On the assumption of the HBM test of 2000V, the protection device effective resistance must be equal to or smaller than 3.7$\Omega$ according to the equation (3). The resistance value of 3.7$\Omega$ is a value in a simplified example and obtained from the following equation:

$$2000V/1500\Omega = 1.333 A$$

Regarding 1.333 A as 1.34 A, $$5V/1.34 A \approx 3.7\Omega$$

Here, it is supposed that the protection device is configured of one type of PN-junction elements. When the forward bias voltage Vf of one PN-junction element is 0.6V, if n=4 and Vh=2.4V, $$(5V-2.4V)=2.6V/1.34 \approx 1.94\Omega, \text{ and}$$

$$1.94/4=0.49\Omega \text{ per PN-junction element 1,}$$

which requires the size of about 200 times of the basic element (the size of 204×4=816 times as a whole).

The same also applies to cases of Vf=0.7V and 0.8V All of these cases are shown in FIG. 2.

In the above-mentioned example, it is found out that Vf of 0.6V requires a large size. Since the resistance r varies depending on Vf in fact, superiority or inferiority cannot be decided based on the above-mentioned simple calculation. Since r generally becomes higher as Vf is smaller, the cases of Vf=0.7V and Vf=0.8V in the above-mentioned example require substantially a same size. According to the conventional technique, although the appropriate PN-junction may be accidentally realized, optimum design cannot be achieved.

In the bulk MOSFET process, when the PN-junction elements are formed without adding a special process, $P^+/N$ well junction and $N^+/P$ well junction are formed. In both junctions, since both well concentrations and both SD (source/drain) diffusion layers ($P^+$, $N^+$) have substantially the same concentration ratio, the forward bias voltages have substantially a same value. A technique of using two types of PN-junctions ($P^+/N$ well junction and $N^+/P$ well junction) for the protection device is known in patent literature 2.

According to the technique described in Patent literature 2, two PN-junction elements are serially connected between two terminals in a reverse direction. However, one is not an external terminal, but a signal line. According to the technique described in the patent literature 2, anodes or cathodes of the elements are connected to each other rather than connecting the anode to the cathode. In this example, at least one of the elements has reverse bias. Both of the PN-junction elements of this structure have a well and the concentration of the P well is substantially the same as that of the N well (substantially the same order). Thus, the voltages Vf are nearly the same.

Citation List:
 [patent literature 1]: JP-A-Heisei 10-512718
 [patent literature 2]: U.S. Pat. No. 6,329,691
 [patent literature 3]: JP 2004-207398A

SUMMARY OF THE INVENTION

In an aspect of the present invention, a semiconductor device has an SOI (Silicon On Insulator) structure and comprising a P-channel FET and an N-channel FET which are formed on an insulating film. The semiconductor device includes: at least two of first, second, third and fourth PN-junction elements. The first PN-junction element is formed from a P-type semiconductor layer and an N-type semiconductor layer having the same impurity concentrations as those of source/drain regions of the P-channel FET and the N-channel FET, respectively. The second PN-junction element is formed from a P-type semiconductor layer and an N-type semiconductor layer having the same impurity concentrations as those of the source/drain region and a channel region in the P-channel FET, respectively. The third PN-junction element is formed from a P-type semiconductor layer and an N-type semiconductor layer having the same impurity concentrations as those of a channel region and the source/drain region in the N-channel FET, respectively. The fourth PN-junction element is formed from a P-type semiconductor layer and an N-type semiconductor layer having the same impurity concentrations as those of the channel regions of the N-channel FET and the P-channel FET, respectively. At least two PN-junction elements are connected in series in a forward bias between two different terminals to form an electrostatic protection device.

In another aspect of the present invention, a semiconductor device includes a P-type FET and an N-type FET formed on an insulating film in an SOI structure. PN-junction elements having different forward bias voltages are formed through a P-type impurity implantation process and an N-type impurity implantation process, and at least two of the PN-junction elements are connected in series.

According to the present invention, a plurality of PN-junction elements with different structures (a plurality of diode characteristics) are prepared and the protection circuit is constituted by combining them, even when the design margin of the electrostatic protection device is strict, it is possible to provide the electrostatic protection device which properly function.

Furthermore, by preparing a plurality of forward bias voltages (hereinafter referred to as Vf), advantageously, the above-mentioned equation (1) can be easily satisfied.

BRIEF DESCRIPTION OF THE DRAWINGS

The above and other objects, advantages and features of the present invention will be more apparent from the following description of certain embodiments taken in conjunction with the accompanying drawings, in which:

FIG. 2 is a table showing relationship between a forward bias voltage Vf of the PN-junction element and junction element size;

FIG. 4 is a table for comparing PN-junction elements in the circuit in the first embodiment in size;

FIGS. 5C-1 to 5C-3 are diagrams showing a method of forming the PN-junction element in the case of the PN-junction ($N^+P^+$) of the source/drain layers as the P-type semiconductor layer and the N-type semiconductor layer;

FIG. 6B is a diagram showing a method of forming the PN-junction element in the case of the PN-junction ($P^-N^-$junction) having the reverse conductive type channel region concentration;

FIGS. 6C-1 to 6C-3 is a diagram showing a method of forming the PN-junction element in the case of the PN-junction ($P^-N^-$junction) having the reverse conductive type channel region concentration;

DESCRIPTION OF EMBODIMENTS

Figure 1A:
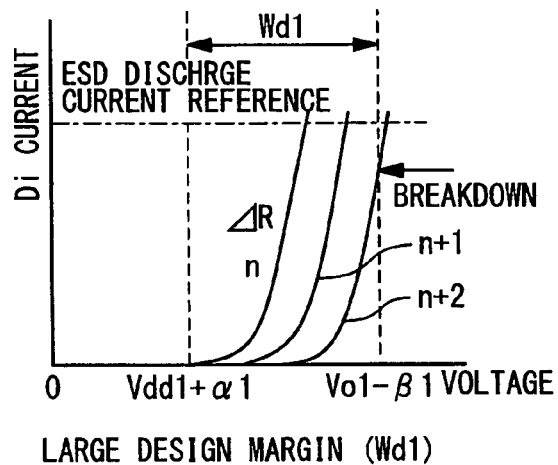
FIG. 1A is a graph showing a relation between a PN-junction element and a Di current in a case of a large design margin (Wd1)
Figure 1B:
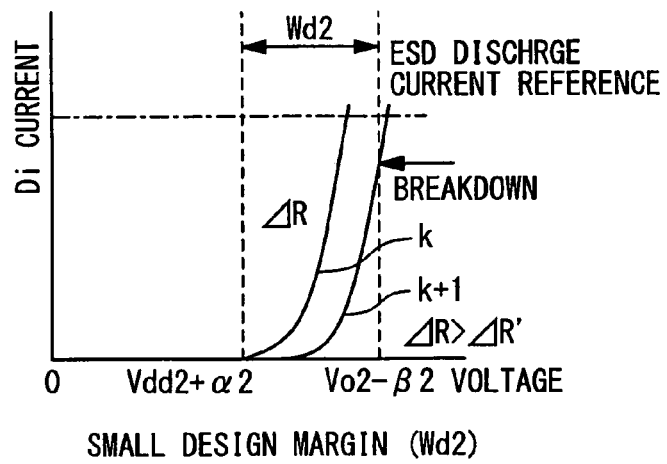
FIG. 1B is a graph showing a relation between the PN-junction element and the Di current in a case of a small design margin (Wd2)
Figure 1C:
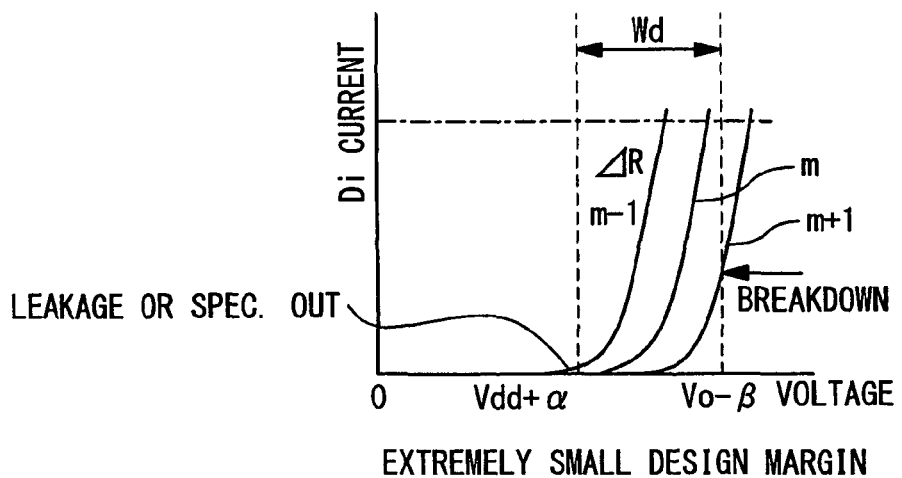
FIG. 1C is a graph showing a relation between the PN-junction element and the Di current in a case of an extremely small design margin.

Hereinafter, a semiconductor of the present invention will be described with reference to the attached drawings. In the attached drawings, the same components are basically assigned with the same reference numeral and redundant description thereof is omitted.

[First Embodiment]

Figure 3:
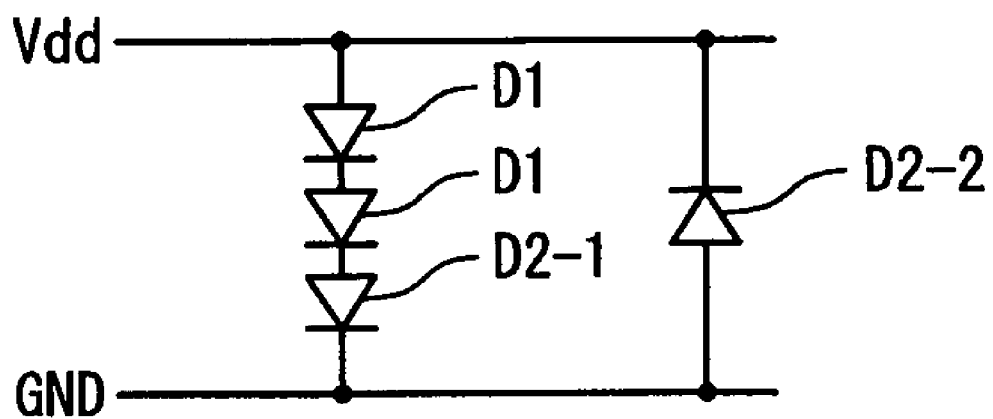
FIG. 3 is a circuit diagram showing a configuration of a semiconductor device according to a first embodiment of the present invention.

FIG. 3 is a circuit diagram showing a configuration of a semiconductor device according to a first embodiment of the present invention. In FIG. 3, as an electrostatic protection device, first PN-junction elements D1 and a second PN-junction element D2-1 are provided between a power supply terminal (power supply line) Vdd and a ground terminal (GND line). A plurality of electrostatic protection devices may be provided in parallel between the terminals. The PN-junction elements D1 are connected in series by a wiring which extend in a direction orthogonal to the PN-junction plane.

A diode D2-2 is connected between the power supply terminal Vdd and the GND terminal in a reverse direction. The diode D2-2 connected in the reverse direction is a protection device for discharging charges when a positive high-voltage surge is applied to the GND terminal. The diode D2-2 is formed to have an enough size not to be broken. The forward bias voltage Vf of the first PN-junction element D1 is 0.8V and the forward bias voltage Vf of the second PN-junction element D2-1 is 0.6V. The circuit shown in FIG. 3 shows an example in which the PN-junction element having the forward bias voltage Vf of 0.7V does not exist. Although the forward bias voltage Vf of the diode D2-2 is 0.6V in FIG. 3, the forward bias voltage Vf of the diode D2-2 may be different from that of the diode D2-1.

FIG. 4 is a table for comparing the PN-junction elements in the circuit of the first embodiment in size. Referring to FIG. 4, Total $Vf=0.6+0.8+0.8=2.2V \rightarrow Vh=2.2V$ Thus, it could be understood that an entire size can be made smaller than that when one type of junction elements having the forward bias voltage Vf of 0.6V or 0.8V are used.

The forward bias voltage Vf of the PN-junction element is expressed as the following equation (4):

$$Vf \cong Vbi = (kT/q) \times ln((Na \times Nd)/ni^2) \quad (4)$$

where Vbi is a diffusion potential (built-in potential) of the PN-junction and the forward bias voltage is a voltage necessary to set Vbi to be zero, q is electronic charge, k is Boltzmann's constant, T is temperature (Kelvin unit), ni is Si intrinsic carrier concentration (about 1.45*1E10 at 300K), Na is an impurity (accepter) concentration in a P-type silicon (well), Nd is an impurity (donor) concentration in an n-type silicon (well), and kT/q is 0.02586V at 300K.

The PN-junction formed in a planar process of the bulk MISFET is a junction between a source/drain diffusion layer and a well or a substrate, and both of a P⁺N junction and an N⁺P junction have a nearly equal forward bias voltage Vf. On the contrary, since the PN-junction is formed as a plane orthogonal to the surface of an insulating film in an SOI structure MISFET process, the forward bias voltage Vf can be varied by controlling an impurity distribution in a lateral direction.

A method of forming PN-junction elements having different values of the forward bias voltage Vf in this embodiment will be described below. In the SOI structure MISFET, the carrier concentration of acceptors or donors in a source/drain region is set to about 1E19 to 1E20/cm³ and the carrier concentration in a channel region is set to 1E15 to 1E17/cm³. Thus, an impurity concentration of the source/drain region is higher than that of the channel region.

When the PN-junction elements are manufactured to have various different forward bias voltages, the following four types PN-junction elements are convenient in the SOI structure. That is, if a semiconductor device having a P-channel FET and an N-channel FET which are formed on the insulating film, the semiconductor device includes at least two of first, second, third and fourth PN-junction elements. The first PN-junction element is formed from a P-type semiconductor layer and an N-type semiconductor layer having the same impurity concentrations as those of source/drain regions of the P-channel FET and the N-channel FET, respectively. The second PN-junction element is formed from a P-type semiconductor layer and an N-type semiconductor layer having the same impurity concentrations as those of the source/drain region and a channel region in the P-channel FET, respectively. The third PN-junction element is formed from a P-type semiconductor layer and an N-type semiconductor layer having the same impurity concentrations as those of a channel region and the source/drain region in the N-channel FET, respectively. The fourth PN-junction element is formed from a P-type semiconductor layer and an N-type semiconductor layer having the same impurity concentrations as those of the channel regions of the N-channel FET and the P-channel FET, respectively.

Next, main PN-junction elements will be described below.

(A) PN-Junction (N⁺P⁺) using Source/Drain Layers

Figure 5A:
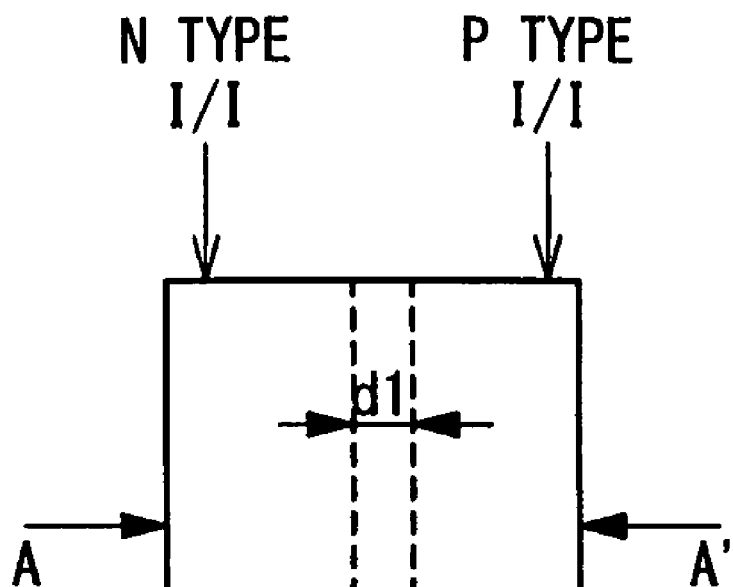
FIG. 5A is a diagram showing a method of forming the PN-junction element in a case of PN-junction ($N^+P^+$) of source/drain layers as a P-type semiconductor layer and a N-type semiconductor layer.
Figure 5A:
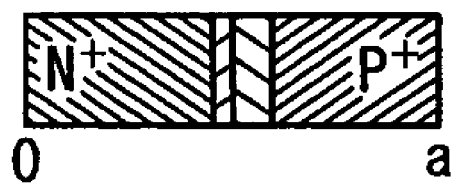
Figure 5B:
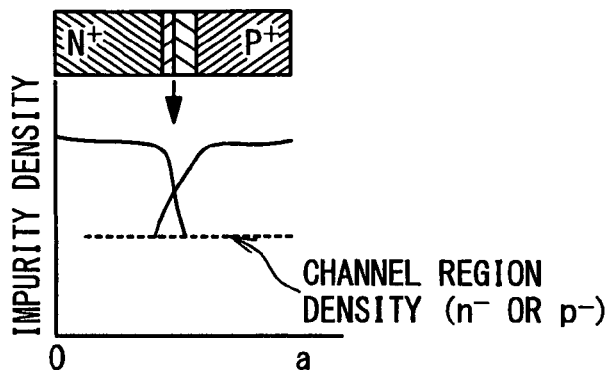
FIG. 5B is a diagram showing a method of forming the PN-junction element in the case of the PN-junction ($N^+P^+$) of the source/drain layers as the P-type semiconductor layer and the N-type semiconductor layer.
Figures 1, 5C:
Figures 2, 5C:
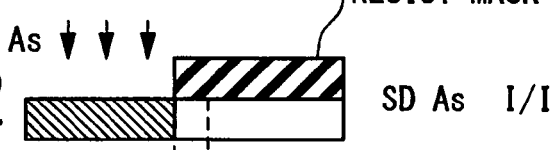
Figures 3, 5C:
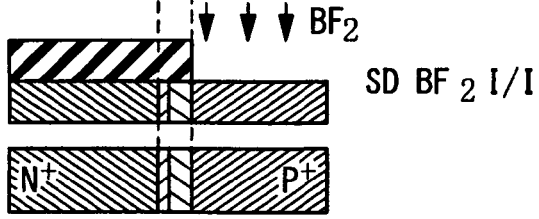

FIGS. 5A, 5B and 5C-1, 5C-2, and 5C-3 are diagrams showing a method of forming the PN-junction element in the case of PN-junction (N⁺P⁺) using the source/drain layers as the P-type semiconductor layer and the N-type semiconductor layer. As shown in FIG. 5C-2, a resist mask is formed and then arsenic ions are implanted for an N-type semiconductor layer, which is formed at a same time as the source/drain regions of the N-channel FET. Also, as shown in FIG. 5C-3, a resist mask is formed and then boronic ions are implanted for a P-type semiconductor layer, which is formed at a same time as the source/drain regions of the P-channel FET. As a result, as shown in FIG. 5A, a non-implantation region is formed between the P-type semiconductor layer and the N-type semiconductor layer, to have the width d1. Then, a thermal process is performed. This thermal process may be an independent thermal process and a thermal process such as a process for forming a thermal oxide film. Through the thermal process, the arsenic ions and the boronic ions are diffused from the N-type semiconductor layer and the P-type semiconductor layer into the non-implantation region in a lateral direction. At this time, the boronic ion has a larger diffusion rate than that of the arsenic ion. Accordingly, the PN-junction plane is formed on the side of the N-type semiconductor layer from the center of the non-implantation region. At this time, the PN-junction may have a polygonal shape or may be a circular shape. A silicide layer may be formed on each of the P-type semiconductor layer and the N-type semiconductor layer. From the above-mentioned equation (2), the forward bias voltage Vf is approximately as follows.

That is, it is assumed that the P-type source/drain diffusion layer and the N-type source/drain diffusion layer which are considerably high concentration diffusion layers are joined with each other. However, since a concentration inclination is actually caused due to lateral direction diffusion, the N-type diffusion layer having the concentration of about 1E18/cm³ and the P-type diffusion layer having the concentration of about 1E17/cm³ are joined with each other. The forward bias voltage Vf calculated from the above-mentioned equation (2) is about 0.9 V.

It should be noted that when the PN-junction of the P-type semiconductor layer and the N-type semiconductor layer which have the concentration of 1E18/cm³ or more is formed, the forward bias voltage Vf calculated from the equation (2) is in a range of 0.95 to 1V.

(B) PN-Junction between a Source/Drain Diffusion Layer and a Channel Region

In the case of the PN-junction between the source/drain diffusion layer and the channel region of a conductive type opposite to that of the source/drain diffusion layer, if the source/drain diffusion layer has the higher concentration of about 1E18 to 1E19/cm³ and the lower concentration side diffusion layer has the low concentration of about 1E15 to 1E16/cm³, the forward bias voltage Vf is in a range of 0.75V to 0.9V (not shown) from the similar calculation to the above case.

(C) PN-Junction between Channel Regions

FIGS. 6A, 6B, 6C-1, 6C-2, and 6C-3 are diagrams showing a method of forming the PN-junction element in the case of P⁻N⁻-junction formed from diffusion layers of the opposite conductive type having channel region concentration.

Figure 6A:
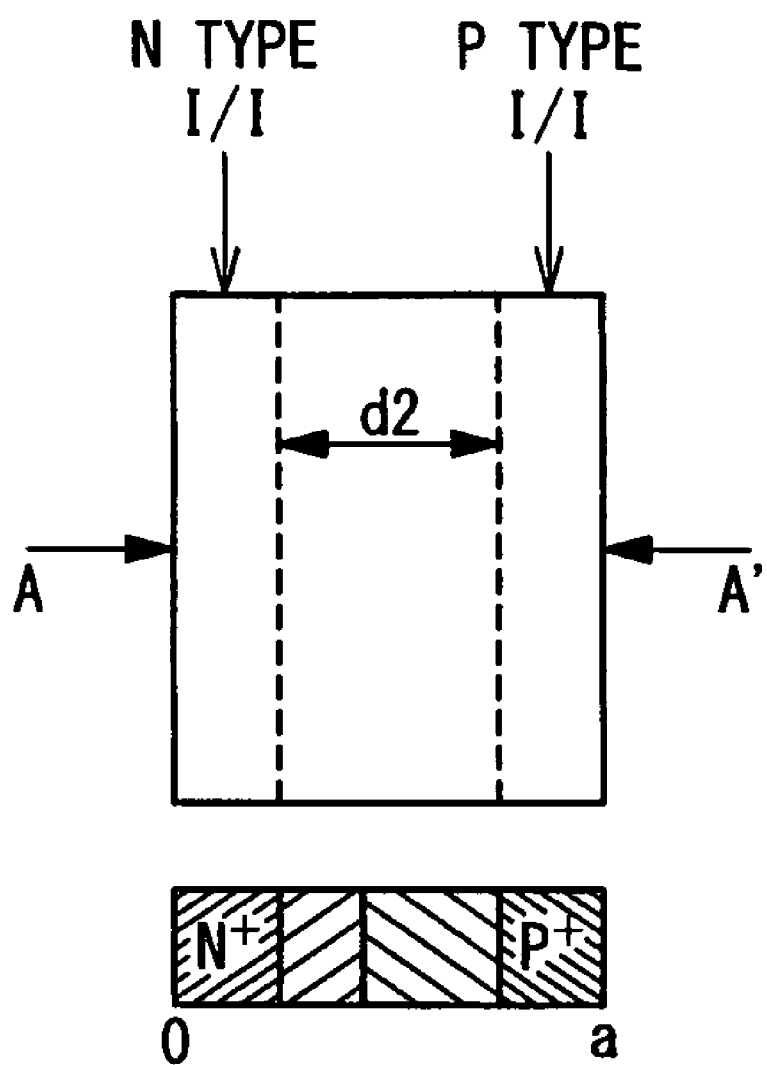
FIG. 6A is a diagram showing a method of forming the PN-junction element in a case of PN-junction ($P^-N^-$junction) having reverse conductive type channel region concentration.

As shown in FIG. 6C-2, a resist mask is formed and then phosphoric ions are implanted for an N-type semiconductor layer, which is formed at a same time as the channel region of the N-channel FET. Also, as shown in FIG. 6C-3, a resist mask is formed and then boronic ions are implanted for a P-type semiconductor layer, which is formed at a same time as the channel region of the P-channel FET. As a result, as shown in FIG. 6A, a non-implantation region is formed between the P-type semiconductor layer and the N-type semiconductor layer, to have the width d2, which is larger than the width d1. Then, a thermal process is performed. This thermal process may be an independent thermal process and a thermal process such as a process for forming a thermal oxide film. Through the thermal process, the phosphoric ions and the boronic ions are diffused from the N-type semiconductor layer and the P-type semiconductor layer into the non-implantation region in a lateral direction. At this time, the boronic ion has a larger diffusion rate than that of the phosphoric ion. Accordingly, the PN-junction plane is formed on the side of the N-type semiconductor layer from the center of the non-implantation region.

In the case of the P⁻N⁻-junction, although both are the diffusion layers having the concentration of about 1E15 to 1E16/cm³, the diffusion layer to which an impurity with a larger diffusion coefficient is injected becomes the lower concentration side diffusion layer. In this case, the forward bias voltage Vf is about 0.6V.

Although a calculation example of the forward bias voltage Vf has been described above, a value of the forward bias voltage Vf varies depending on definition of the forward bias voltage Vf. For example, although the forward bias voltage Vf is set to a range of 0.6 to 1.0V in the above-mentioned example, the forward bias voltage Vf may be set to from 0.3 to 0.7V. This is similar to a case that a threshold voltage of the MOSFET varies depending of its definition. At this time, a relation between Vdd, Vh, and Vo is changed from the above-mentioned relation. That is, Vh or Vo is regarded as a smaller value than described above.

In order to form the PN-junction in the process of an SOI structure, in the above-mentioned cases (B) and (C), there are two methods, in one method, a first impurity of a first conductive type is implanted in a whole region and then a part of the region is inverted by implanting a second impurity of a second conductive type opposite to the first conductive type, and in the other method, the fist impurity of the first conductive type is implanted in a first region and the second impurity of the second conductive type is implanted in a second region joining the first region. Although characteristics of the resultant PN-junction element slightly vary depending on the process (impurity concentration, thermal process and the like), the PN-junction element can be configured in the SOI structure process such that the forward bias voltage Vf has a value of about 0.6V to about 1V theoretically, as described above.

Furthermore, the forward bias voltage Vf can be controlled, as shown in FIG. 3, in the SOI structure process. That is, a region in which neither the P-type impurity nor the N-type impurity are implanted are appropriately provided. In the above-mentioned case (A), the impurity profile in the junction portion is changed by appropriately changing the width d2 of a region in which impurity is not implanted. In the above-mentioned case (C), the width d2 of a region in which channel impurity implantation is not performed is similarly changed. Here, in this case, when d2 is increased, there is a possibility that an intrinsic layer is formed. Application to products can be performed without any problem by estimating dependency of the width d2 by means of TEG.

The above-mentioned cases are predicated on that an impurity implantation is not separately added for an electrostatic protection device. Needless to say, the forward bias voltage Vf can be easily optimized by separately adding the impurity implantation. As described above, in the semiconductor device in this embodiment, optimum design of the electrostatic protection circuit (in particular, optimization of the area of the protection circuit) can be achieved by preparing a plurality of forward bias voltages Vf.

[Second Embodiment]

Figure 7A:
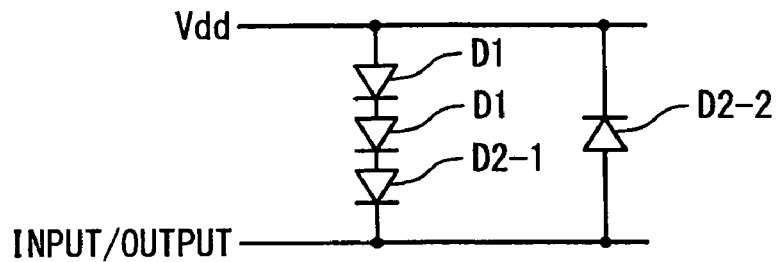
FIG. 7 is a circuit diagram showing a configuration in accordance with a second embodiment of the present invention.
Figure 7B:
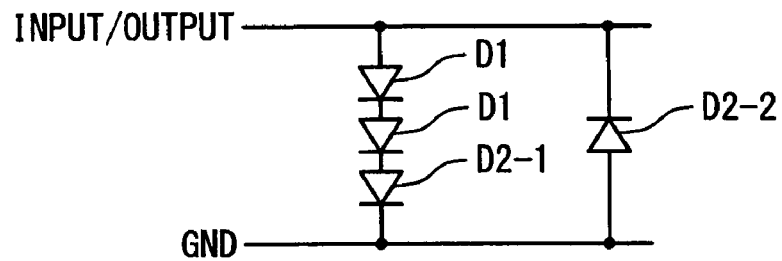

FIGS. 7A and 7B are circuit diagrams showing a configuration of the semiconductor device according to a second embodiment of the present invention. FIG. 7A shows a circuit configuration when the electrostatic protection device is provided between an input/output terminal and the power supply terminal. FIG. 7B shows a circuit configuration when the electrostatic protection device is provided between the input/output terminal and the GND terminal. Here, it is preferred that the electrostatic protection device provided between the terminals is optimized by changing a combination of PN-junction elements.

In addition, the electrostatic protection device may be provided between an internal circuit signal terminal and one of the power supply terminal or the ground terminal.

As described above, the voltage Vh can be made closer to an ideal value when a plurality of PN-junction elements of a plurality of types are serially connected (to have the forward bias voltage Vf as a whole), as compared to the case that a plurality of PN-junction elements of one type are serially connected. As described above, the electrostatic protection device which cannot be realized by the bulk MOSFET device can be suitably realized by using the SOI structure FET device.

[Third Embodiment]

Figure 8:
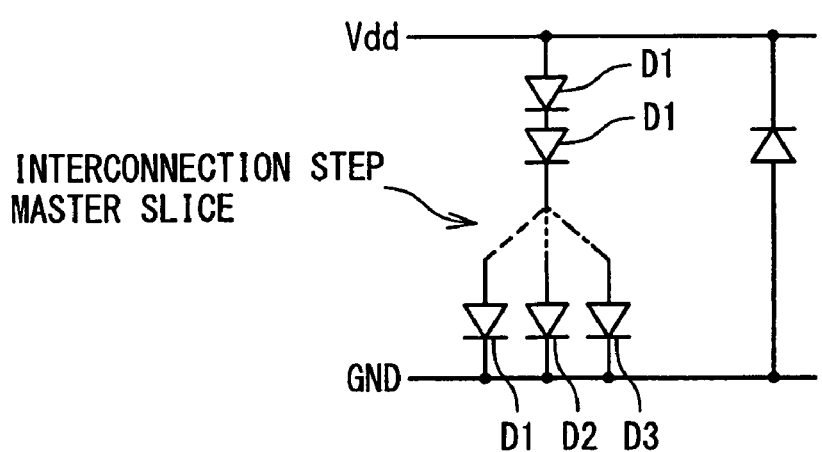
FIG. 8 is a circuit diagram showing a configuration in accordance with a third embodiment of the present invention.

FIG. 8 is a circuit diagram showing a configuration of the semiconductor device according to a third embodiment of the present invention. In an actual product, there are cases where a PN-junction element cannot be estimated and determined by use of TEG in advance and the forward bias voltage Vf varies due to manufacturing variation. For such cases, design optimization is performed by forming the plurality of PN-junction elements in advance and then by changing a path connection in a wiring step or switching a path by a fuse element.

As shown in FIG. 8, a circuit in the third embodiment includes the PN-junction elements in three stages as in the first embodiment. These can be switched through a wiring step master slice. Thus, a combination having a highest ESD endurance can be selected. As a result, in the third embodiment, the electrostatic protection circuit can be configured in the best condition (the best condition in terms of the ESD resistance). This configuration can also deal with an extremely strict design margin.

The embodiments of the present invention have been specifically described. As described above, in the electrostatic protection device constituted from the plurality of PN-junction elements connected in series in the forward bias direction, by using the PN-junction elements having two types or more of forward bias voltages, the ESD resistance of the electrostatic protection device can be improved. Furthermore, the size of the whole of the electrostatic protection device can be reduced. The present invention is not limited to the above-mentioned embodiments and can be variously modified without departing from the subject matter.

What is claimed is:

1. A semiconductor device having an SOI (Silicon On Insulator) structure and comprising a P-channel FET and an N-channel FET which are formed on an insulating film, said semiconductor device comprising:
    at least two of first, second, third and fourth PN-junction elements,
    wherein said first PN-junction element is formed from a P-type semiconductor layer and an N-type semiconductor layer having the same impurity concentrations as those of source/drain regions of said P-channel FET and said N-channel FET, respectively,
    wherein said second PN-junction element is formed from a P-type semiconductor layer and an N-type semiconductor layer having the same impurity concentrations as those of the source/drain region and a channel region in said P-channel FET, respectively,
    wherein said third PN-junction element is formed from a P-type semiconductor layer and an N-type semiconductor layer having the same impurity concentrations as those of a channel region and the source/drain region in said N-channel FET, respectively,
    wherein said fourth PN-junction element is formed from a P-type semiconductor layer and an N-type semiconductor layer having the same impurity concentrations as those of the channel regions of said N-channel FET and said P-channel FET, respectively, and
    wherein said at least two PN-junction elements are connected in series in a forward bias between two different terminals to form an electrostatic protection device.

2. The semiconductor device according to claim 1, wherein a junction plane of each of said first to fourth PN-junction elements is orthogonal to a plane of said insulating film.

3. The semiconductor device according to claim 1, wherein a plurality of sets of said at least two PN-junction elements connected in series are connected in parallel.

4. The semiconductor device according to claim 1, wherein a set of said two different terminals are one of a set of a power supply terminal and a ground line terminal, a set of an input/output signal terminal and said power supply terminal, a set of said input/output signal terminal and said ground line terminal, a set of an internal power supply terminal and said ground line terminal, and a set of an internal signal line terminal and said ground line terminal.

5. The semiconductor device according to claim 1, wherein a summation of forward bias voltages corresponding to said at least two PN-junction elements between said two different terminals is larger than a power supply voltage or a signal voltage applied between said two different terminals.

6. The semiconductor device according to claim 1, wherein said P-type semiconductor layer of one of said at least two PN-junction elements is connected to an N-type semiconductor layer of the other of said at least two PN-junction elements by a conductive wiring which extends in a direction orthogonal to a PN-junction plane of said one PN-junction element.

7. The semiconductor device according to claim 1, wherein each of said first to fourth PN-junction elements has a non-implantation region between two semiconductor layers in which impurities are implanted, and a junction plane is formed in the non-implantation region through a thermal process.

8. The semiconductor device according to claim 1, wherein each of said P-type FET and said N-type FET comprises source/drain regions of an LDD structure.

9. The semiconductor device according to claim 1, wherein a PN-junction plane of each of said first to fourth PN-junction elements has a polygonal shape or a circular shape.

10. The semiconductor device according to claim 1, wherein each of said first to fourth PN-junction elements has a semiconductor layer formed on said insulating film,
    said semiconductor layer has a P-type impurity implantation region, an N-type impurity implantation region and a non-implantation region therebetween, and
    a PN-junction of said PN-junction element is formed in said non-implantation region.

11. The semiconductor device according to claim 1, wherein each of said P-type FET and said N-type FET of the SOI structure is a FinFET or a column-like MISFET, and
    one of said P-type semiconductor layer and said N-type semiconductor layer includes a source/drain diffusion region of said FinFET or said column-like MISFET.

12. The semiconductor device according to claim 1, wherein silicide layers are formed on predetermined areas of said P-type and N-type semiconductor layers.

13. The semiconductor device according to claim 1, wherein said electrostatic protection device further comprises a-plurality of PN-junction elements of said first to fourth PN-junction elements, and one of said plurality of PN-junction elements is selectively connected to said at least two PN-junctions by fuse elements or a wiring whose pattern is changed.

14. A-semiconductor device comprising a P-type FET and an N-type FET formed on an insulating film in an SOI structure,
    wherein PN-junction elements having different forward bias voltages are formed through a P-type impurity implantation process and an N-type impurity implantation process, and
    wherein at least two of said PN-junction elements are connected in series.

15. The semiconductor device according to claim 14, wherein a P-type semiconductor layer of one of said at least two PN-junction elements is connected to an N-type semiconductor layer of the other of said at least two PN-junction elements by a conductive wiring which extends in a direction orthogonal to a PN-junction plane of said one PN-junction element.

16. The semiconductor device according to claim 14, wherein each of said first to fourth PN-junction elements has a semiconductor layer formed on said insulating film,
    said semiconductor layer has a P-type impurity implantation region, an N-type impurity implantation region and a non-implantation region therebetween, and
    a PN-junction of said PN-junction element is formed in said non-implantation region.

17. The semiconductor device according to claim 14, wherein each of said P-type FET and said N-type FET comprises source/drain regions of an LDD structure.

18. The semiconductor device according to claim 14, wherein a PN-junction plane of each of said first to fourth PN-junction elements has a polygonal shape or a circular shape.

19. The semiconductor device according to claim 14, wherein each of said first to fourth PN-junction elements has a semiconductor layer formed on said insulating film,
    said semiconductor layer has a P-type impurity implantation region, an N-type impurity implantation region and a non-implantation region therebetween, and
    a PN-junction of said PN-junction element is formed in said non-implantation region,
    The said half conductor layer has the Anne dope area which doesn't pour N-type impurities and P-type impurities.

20. The semiconductor device according to claim 14, wherein each of said P-type FET and said N-type FET of the SOI structure is a FinFET or a column-like MISFET, and
    one of said P-type semiconductor layer and said N-type semiconductor layer includes a source/drain diffusion region of said FinFET or said column-like MISFET.

* * * * *